(12) United States Patent
Gutman et al.

(10) Patent No.: US 10,541,657 B2
(45) Date of Patent: Jan. 21, 2020

(54) METHOD AND APPARATUS FOR DIGITAL PRE-DISTORTION WITH REDUCED OVERSAMPLING OUTPUT RATIO

(71) Applicant: QUALCOMM Incorporated, San Diego, CA (US)

(72) Inventors: Igor Gutman, Ramat Gan (IL); Ariel Sagi, Haifa (IL); Alecsander Eitan, Haifa (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/688,766

(22) Filed: Aug. 28, 2017

(65) Prior Publication Data

US 2019/0068133 A1 Feb. 28, 2019

(51) Int. Cl.
*H04L 27/36* (2006.01)
*H03F 1/32* (2006.01)
*H03M 1/00* (2006.01)
*H04B 1/00* (2006.01)

(52) U.S. Cl.
CPC ......... *H03F 1/3247* (2013.01); *H03F 1/3294* (2013.01); *H03F 2200/102* (2013.01); *H03M 1/001* (2013.01); *H04B 1/0017* (2013.01)

(58) Field of Classification Search
CPC .............................. H04L 27/367; H04L 27/368
USPC ........................................................ 375/296
See application file for complete search history.

(56) References Cited

U.S. PATENT DOCUMENTS

| | | | | |
|---|---|---|---|---|
| 6,298,097 | B1 * | 10/2001 | Shalom | H03F 1/3241 375/296 |
| 6,614,374 | B1 * | 9/2003 | Gustavsson | H03H 19/004 341/118 |
| 8,005,162 | B2 | 8/2011 | Cai et al. | |
| 9,184,710 | B2 | 11/2015 | Braithwaite | |
| 9,225,363 | B2 | 12/2015 | Wu et al. | |

(Continued)

OTHER PUBLICATIONS

C., "FPGA Bulding Blocks for an Hybrid Base Band Digital Predistorter Suitable for 3G Power\Amplifiers", MEDIATRON Laboratory—Ecole Supérieure de Communication (SUP'COM), 2005, pp. 1-4.

(Continued)

*Primary Examiner* — Kevin M Burd
(74) *Attorney, Agent, or Firm* — Steven R. Thiel; Loza & Loza LLP

(57) ABSTRACT

Certain aspects of the present disclosure are directed to a digital predistortion (DPD) device for use within a wireless transmitter that permits the use of a downstream digital-to-analog converter that operates at a clock rate close to the bandwidth of a digital baseband input signal. In some examples, a sampling rate of a digital baseband input signal is increased using an upsampler to obtain an increased rate digital input signal. Predistortion is applied to the increased rate digital input signal using a DPD device to obtain a predistorted digital signal. The sampling rate of the predistorted digital signal is then decreased using a downsampler to obtain a lower-rate predistorted digital signal with a sampling rate below the increased rate of the upsampler (e.g. close to the bandwidth of a digital baseband input signal). A low pass filter may be provided to filter out-of-band signal components from the predistorted digital signal.

11 Claims, 16 Drawing Sheets

DPD with Reduced Output Sampling Rate

(56) References Cited

U.S. PATENT DOCUMENTS

| | | | |
|---|---|---|---|
| 2012/0286985 A1* | 11/2012 | Chandrasekaran ... | H03F 1/3247 341/144 |
| 2016/0118946 A1* | 4/2016 | Miyanaga ............. | H03F 1/3247 330/291 |
| 2017/0047954 A1 | 2/2017 | Tian et al. | |
| 2017/0338841 A1* | 11/2017 | Pratt .................... | H04B 1/0475 |

OTHER PUBLICATIONS

International Search Report and Written Opinion—PCT/US2018/040025—ISA/EPO—dated Sep. 27, 2018.

\* cited by examiner

*Exemplary Predistortion Method
Using a Polyphase Filters*

1000

1002
Demultiplex an input baseband digital signal into M signals, where, e.g., M is 5, subject to a modulo M counter driven by a clock signal at the sampling rate of the input baseband digital signal to apply signal values in a round robin fashion to a set of M polyphase filters.

1004
Filter the demultiplexed signals using the M polyphase filters to decompose the input signal into M signals each having an effective sampling rate of 1/M.

1006
Apply a set of N+1 predistortion coefficients to each of the upsampled signals using respective predistortion modules for reducing the distortion of the eventual output signal of the transmitting device.

1008
Filter the resulting signals using another set of the M polyphase filters to substantially remove out-of-band components of each of the M signals.

1010
Multiplex the M signals based on a signal generated by a second modulo-M counter driven by a clock at the same sampling rate as the input baseband digital signal to restore the signal to its original sampling rate, and output the signal to the DAC of the transmitter.

*FIG. 10*

US 10,541,657 B2

METHOD AND APPARATUS FOR DIGITAL PRE-DISTORTION WITH REDUCED OVERSAMPLING OUTPUT RATIO

TECHNICAL FIELD

The invention relates generally to wireless communications systems and, more particularly, to methods and apparatus for digital pre-distortion (DPD).

BACKGROUND

A signal transmitting device, such as those used in wireless communications, typically includes a power amplifier (PA) for amplifying a radio-frequency (RF) signal with sufficient power for wireless transmission to remote devices via one or more antennas. For power efficiency objectives, the input RF signal applied to a PA is set to a power level to drive the PA as close to saturation as possible. However, this results in distortion in the output signal produced by the PA. Digital predistortion (DPD) is often employed to reduce the distortion in a PA's output signal. This disclosure relates to reducing power consumption and complexity associated with DPD.

SUMMARY

Certain aspects of the present disclosure provide an apparatus for wireless communications. The apparatus comprises: a processing system configured to generate a first signal with a first sampling rate by converting a second signal associated with a second sampling rate, the first sampling rate being higher than the second sampling rate; generate a third signal by predistorting the first signal; and generate a fourth signal with a third sampling rate by converting the third signal to the third sampling rate, the third sampling rate being lower than the first sampling rate; and an interface configured to output the fourth signal for transmission.

Certain aspects of the present disclosure provide a method for wireless communications. The method comprises: generating a first signal with a first sampling rate by converting a second signal associated with a second sampling rate, the first sampling rate being higher than the second sampling rate; generating a third signal by predistorting the first signal; generating a fourth signal with a third sampling rate by converting the third signal to the third sampling rate, the third sampling rate being lower than the first sampling rate; and outputting the fourth signal for transmission.

Certain aspects of the present disclosure provide an apparatus for wireless communications. The apparatus comprises: means for generating a first signal with a first sampling rate by converting a second signal associated with a second sampling rate, the first sampling rate being higher than the second sampling rate; means for generating a third signal by predistorting the first signal; means for generating a fourth signal with a third sampling rate by converting the third signal to the third sampling rate, the third sampling rate being lower than the first sampling rate; and means for outputting the fourth signal for transmission.

Certain aspects of the present disclosure provide a computer readable medium having instructions stored thereon for: generating a first signal with a first sampling rate by converting a second signal associated with a second sampling rate, the first sampling rate being higher than the second sampling rate; generating a third signal by predistorting the first signal; generating a fourth signal with a third sampling rate by converting the third signal to the third sampling rate, the third sampling rate being lower than the first sampling rate; and outputting the fourth signal for transmission.

Certain aspects of the present disclosure provide a wireless node comprising: a processing system configured to: generate a first signal with a first sampling rate by converting a second signal associated with a second sampling rate, the first sampling rate being higher than the second sampling rate; generate a third signal by predistorting the first signal; and generate a fourth signal with a third sampling rate by converting the third signal to the third sampling rate, the third sampling rate being lower than the first sampling rate; and a transmitter configured to transmit the fourth signal.

Certain aspects of the present disclosure also provide various other apparatus, methods, and computer readable medium for performing the operations described herein.

BRIEF DESCRIPTION OF THE DRAWINGS

FIG. 10 illustrates exemplary operations that may be performed by reduced output sampling rate DPD device employing polyphase filtering, in accordance with aspects of the present disclosure.

DETAILED DESCRIPTION

Figure 1:
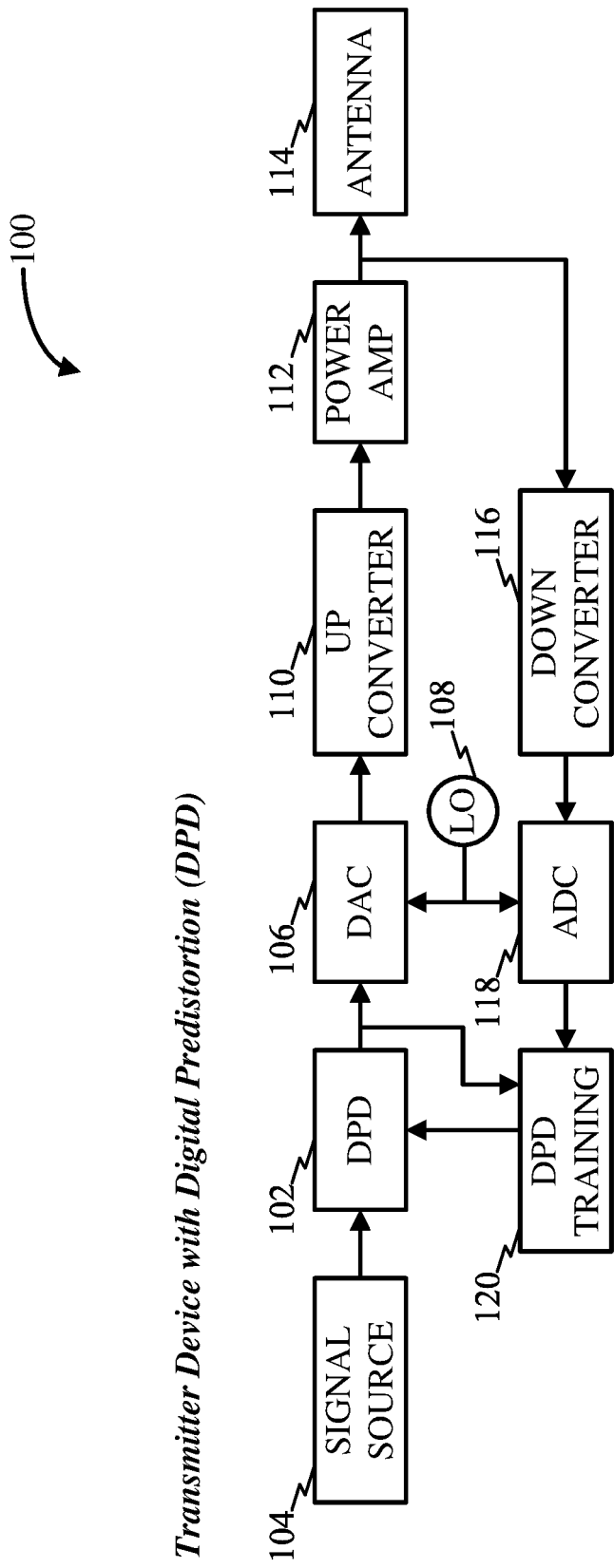
FIG. 1 is a block diagram illustrating a transmitter equipped for digital predistortion (DPD), in accordance with the prior art.

Aspects of the present disclosure are directed to providing digital predistortion (DPD) devices for use within a wireless transmitter that permits the use of digital-to-analog (DAC) and analog-to-digital (ADC) converters that operate at clock rates close to the bandwidth of a digital baseband input signal to, for example, allow for a substantial reduction in power consumption and complexity in the transmitting device. This may be achieved with the reduced output rate DPD devices described herein. In some examples, the reduced output rate DPDs are primarily adapted to reduce the in-band distortion of the output signal, more so than out-of-band distortion.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

A signal transmitting device, such as those used in wireless communications, typically includes a power amplifier (PA) for amplifying a radio-frequency (RF) signal with sufficient power for wireless transmission to remote devices via one or more antennas. Although the PAs may be fairly linear at lower amplification levels far from saturation, PAs can become significantly non-linear at or near saturation. For applications where power efficiency is not crucial, non-linearity can be avoided by backing off the PA from saturation into a linear realm. For wireless communications, power efficiency is often quite important, so the input RF signal applied to a PA is set to a power level to drive the PA as close to saturation as possible.

Although driving the PA close to saturation improves power efficiency, it can also significantly distort the output signal from the PA due to the non-linearity of the PA, particularly when the input RF signal has a high peak-to-average-power ratio (PAPR) as is common in wireless communications. The resulting signal distortion has two main components: an in-band component and an out-of-band component. The in-band distortion can result in an increase in the error vector magnitude (EVM) of the in-band signal component. The out-of-band distortion can result in pollution or interference with adjacent channel transmission, i.e., adjacent channel interference (ACI).

To operate the PA as close as possible to saturation for power efficiency purposes, while also reducing distortion of the output signal of the PA, many wireless transmitters employ digital pre-distortion (DPD). With DPD, the non-linear effects of the PA on the output signal are modeled, and an inverse distortion is applied to the baseband digital signal so that any subsequent distortion introduced by the non-linearity of the PA near saturation can be mostly cancelled out. In this manner, the degree of backoff from saturation can be reduced as compared to transmitters without DPD, thus improving power efficiency without introducing significant signal distortion.

FIG. 1 illustrates an exemplary wireless RF transmitting device 100 including a closed-loop DPD device 102, i.e. a DPD device with feedback. A baseband digital signal from a signal source 104 is applied to the DPD 102. The DPD 102 upsamples the baseband digital signal to, e.g., five times the bandwidth of the baseband signal, then applies predistortion to correct the distortion of the eventual transmitted output signal. More specifically, the predistorted upsampled signal generated by the DPD 102 is applied to a digital-to-analog converter (DAC) 106, which converts the predistorted signal into an analog signal using a clock with a frequency at least five times greater than the bandwidth of the baseband signal, with the clock for the DAC 106 generated by a local oscillator (LO) 108. The analog signal output from DAC 106 is frequency upconverted by an upconverter 110 to produce an RF signal. The RF signal is then amplified by a PA 112 to generate an output signal for applying to an antenna 114 for radiating the signal into free space to, e.g., transmit data from one wireless device to another.

A portion of the output signal provided by the PA 112 is sampled (via a direction coupler, not shown) and fed back to a downconverter 116. The downconverter frequency-downconverts the feedback signal to generate a baseband feedback signal that is applied to an analog-to-digital converter (ADC) 118. The ADC 118 converts the baseband feedback analog signal into a baseband feedback digital signal at a clock rate five times greater than the original baseband signal bandwidth. The LO 108 also generates the clock for the ADC 118. The feedback digital signal from the ADC 118 is applied to a DPD training module 120, which also receives feedback directly from the DPD 120. The DPD training module 120 models the in-band and out-of-band distortion of the PA output signal and generates or adaptively adjusts predistortion coefficients for the DPD 102. The DPD 102 predistorts the baseband digital signal, as discussed above, based on the predistortion coefficients to reduce the distortion of the final output signal.

Figure 2:
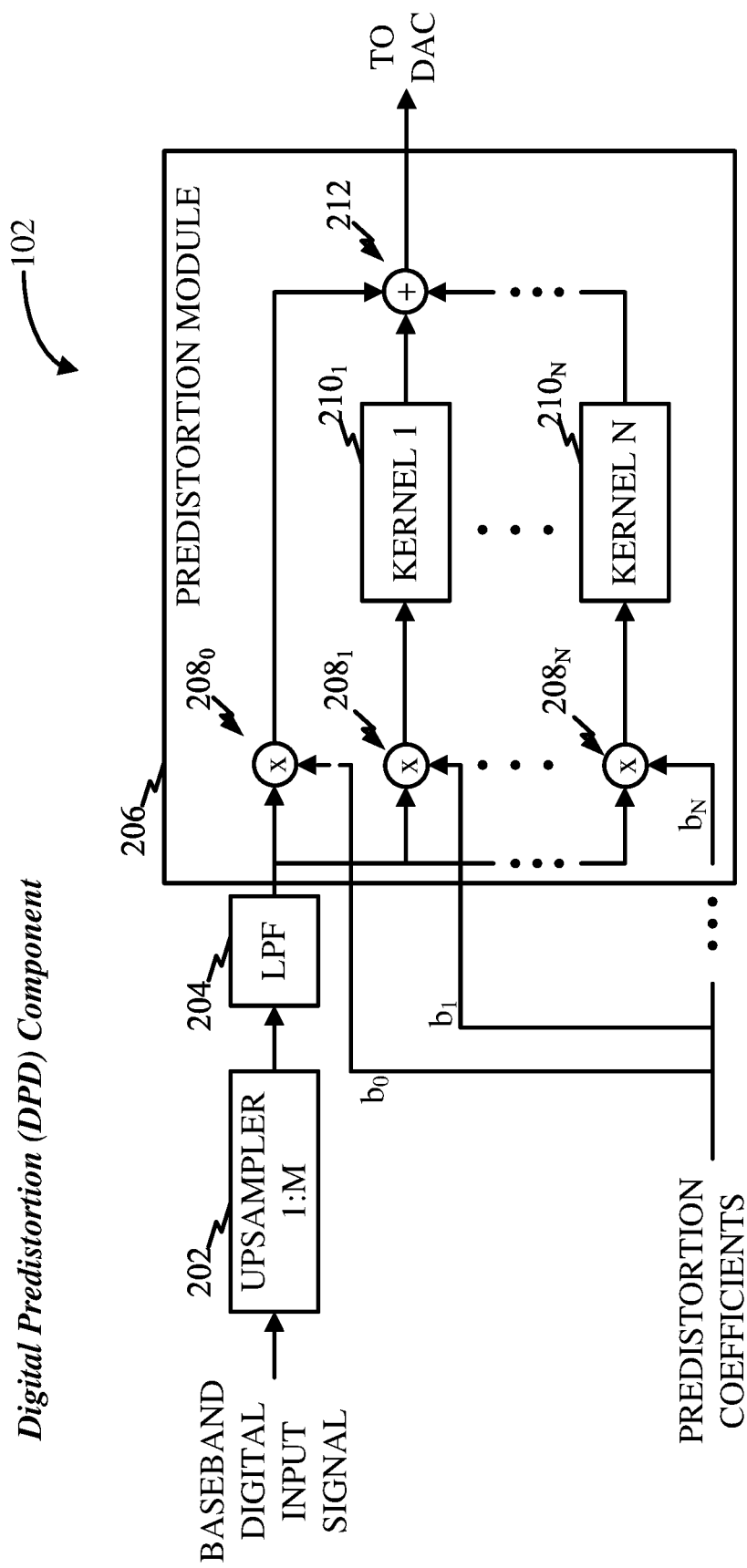
FIG. 2 is a block diagram illustrating a DPD component of the transmitter of FIG. 1, also in accordance with the prior art.

FIG. 2 is a block diagram of an exemplary DPD 102 that may be used in the transmitter of FIG. 1. The DPD 102 includes an upsampler (1:M) 202, a low pass filter (LPF) 204, and a predistortion module 206. The predistortion module 206 includes N+1 multipliers $208_0$-$208_N$, N kernels $210_1$-$210_N$, and an adder 212, connected as shown. The upsampler 202 oversamples an input baseband digital signal by, for example, a factor of five greater than the bandwidth of the baseband digital input signal (by using an appropriate value for M). In an example where the baseband is at 2 GHz, the upsampled signal is then 10 GHz. The LPF 204 is configured to substantially eliminate any replicas from the upsampled signal resulting from the oversampling operation of the upsampler 203. The oversampled signal is applied to respective first inputs of the N+1 multipliers 208. Predistortion coefficients $b_0$ to $b_N$ (initially generated by a DPD training module in a preprocessing procedure not shown in FIG. 2) are applied to respective second inputs of the N+1 multipliers 208. The output of the zero$^{th}$ multiplier $208_0$ is applied directly to one input of the adder 212. The outputs of the other multipliers $208_1$-$208_N$ are applied to inputs of kernels $210_{1-N}$, respectively. The outputs of the kernels $210_1$-$210_N$ are applied to respective inputs of the adder 212. The adder 212 outputs the predistorted upsampled signal, which is applied to the input of the DAC (as in FIG. 1).

A possible drawback of the transmitter device 100, including the DPD 102, is that the predistorted signal output from the DPD 102 is at an oversampled rate (e.g. a rate five times the bandwidth of the baseband input signal). Since the predistorted signal is then applied to a DAC, the DAC needs to be capable of properly processing the high rate predistorted signal. For the example where the upsampled signal is at 10 GHz, the output of the DPD is likewise at 10 GHz and the DAC therefore should be capable of properly operating at that high rate. The ADC should be capable of properly operating at that high rate, as well. The processing of the oversampled signal by the DAC and ADC can thereby consume considerable power and may require complex hardware to handle the large bandwidth of the high rate signals. Similar drawbacks may arise in open loop DPD transmitters, as well, i.e. transmitters that do not include feedback features (such as components 116, 118 and 120 of FIG. 1). With open-loop DPD, the predistortion coefficients are not adaptively adjusted by the transmitter while it is in use. Rather, predetermined coefficients are used that are pre-calibrated using factory calibration.

Illustrative Apparatus Examples of a Reduced Output Rate DPD

Exemplary DPDs described herein help eliminate the need to provide a highly oversampled signal to the DACs and ADCs of a radiofrequency (RF) wireless transmitter. Within some standard DPDs, oversampling of at least five (5) times the bandwidth of the digital baseband signal is employed to help reduce the out-of-band distortion. The DAC and the ADC are then operated at clock rates that correspond to the oversampling rate of the DPD (e.g. five times the bandwidth of the signal), which may have significant disadvantages in terms of power consumption and circuit space.

With the reduced output rate DPDs described herein, the predistorted digital signal output from the DPD device to the DAC may have a sampling rate less than 1.5 times the bandwidth of the digital baseband input signal, even in cases where the DPD operates at an oversampling rate of five times the bandwidth of the digital baseband input signal. This allows the DAC (and any ADCs that receive feedback RF signals) to operate at clock rates much closer to the bandwidth of the baseband signal, which can substantially reduce the power consumption and complexity of the transmitting device.

In one example where the DPD oversamples at an upsampling ratio of five, the oversampling ratio of signals applied to the DAC may be set to only 1.32 while still providing reliable conversion of digital to analog. In that example, if the bandwidth of the baseband input signal to the transmitter is 2 GHz, the DAC then operates at only 2.64 GHz, which can provide a substantial reduction in power consumption and design complexity as compared to a DAC that would otherwise need to operate at 10 GHz to accommodate high rate output signals from a conventional DPD.

To be clear, oversampling is still used to generate high sampling rate signals (e.g. ×5) for internal processing by the DPDs described herein to allow the DPDs to efficiently reduce the in-band distortion of the final transmitted RF signal so as to reduce the error vector magnitude (EVM). However, the outputs of the reduced output date DPDs described herein are at a much lower sampling rate than the sampling rate of the signals processed internally by the DPD, and so the DAC (and other downstream components such as feedback ADCs) need not operate at that same high sampling rate. The DPDs described herein are referred to as "reduced output sampling rate DPDs" since the sampling rate of signals output from the DPDs to downstream components such as DACs is reduced relative to the input or internal DPD sampling rate.

Some features described herein may be particularly applicable in cases where a fair amount of out-of-band distortion of the output signal may be tolerated. For instance, if the spectrum mask requirement for the transmitting device has a lenient specification, then in at least some examples described herein the DPD is configured to primarily correct for in-band distortion, with a greater amount of out-of-band distortion tolerated.

Figure 3:
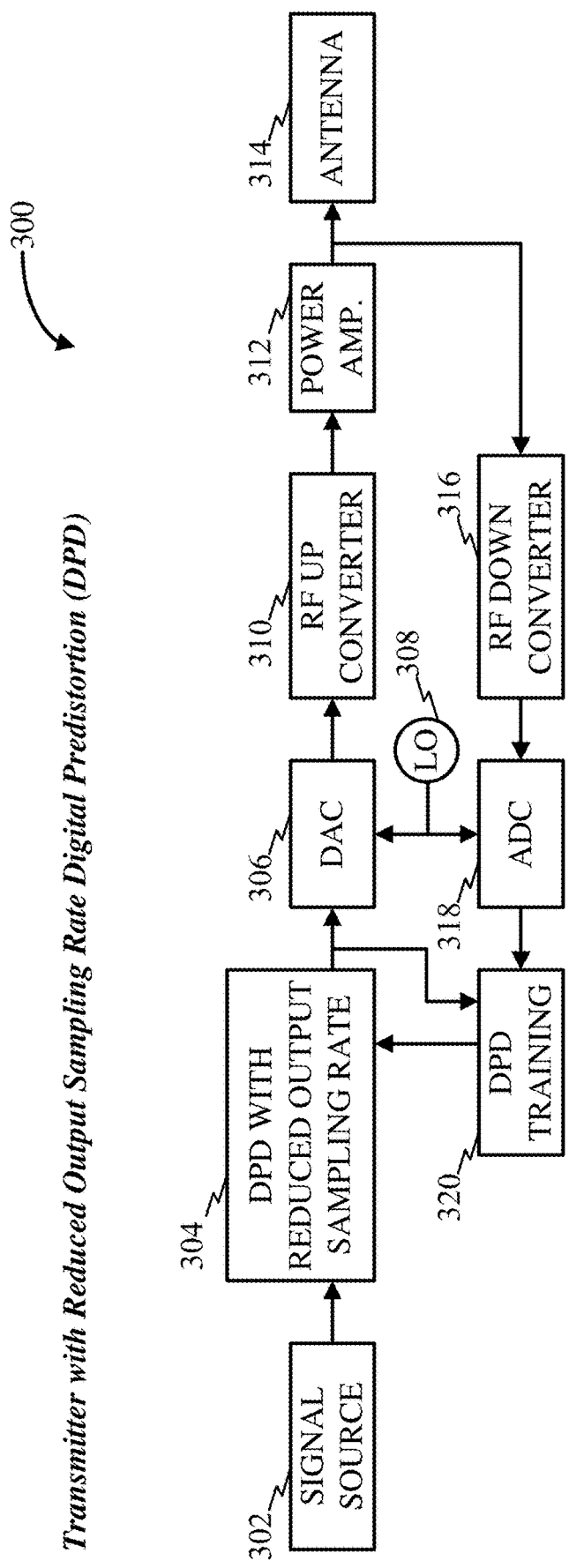
FIG. 3 is a block diagram illustrating an exemplary transmitter equipped for reduced output sample rate DPD, in accordance with aspects of the present disclosure.

FIG. 3 is a high-level block diagram of an exemplary transmitter 300 including a DPD 304 with a reduced output sampling rate. The transmitter 300 may be the same as the transmitter 100, discussed above, with the exception of the DPD 304, and hence most of the components of the transmitter 300 will only be briefly described in this section. A digital baseband input signal from a signal source 302 is applied to the DPD 304. The DPD 304 includes components to (1) increase the sampling rate of the input baseband digital signal by M times the bandwidth of the baseband signal (i.e. it upsamples the input signal by M:1); (2) apply predistortion to the upsampled signals to reduce the distortion of the eventual RF output signals of the transmitter; and (3) decrease the sampling rate of the predistorted signal back to the original rate (i.e. it downsamples the predistorted signal by 1:M). M may be, for example, set to five (5), but might be set to other values, depending upon the needs and tolerances of the particular system, such as values in the range of 3 to 10, i.e. the signal is oversampled by at least three (3) times, with a higher value for M typically yielding better in-band distortion correction.

The predistorted digital signal output from the DPD 304 is then applied to a DAC 306, which may operate at a clock rate near or just above the bandwidth of the baseband signal (e.g. only 1.32 times the baseband bandwidth). The DAC 306 converts the predistorted digital signal into an analog signal, with the clock for the DAC 306 generated by a local oscillator (LO) 308. The signal output from DAC 306 is frequency upconverted by an RF upconverter 310 to produce an RF signal, which is then amplified by a PA 312 to generate the final output signal for applying to an antenna 314 or other transmitter.

A portion of the output signal provided by the PA 312 is sampled and fed back to an RF downconverter 316. The downconverter frequency-downconverts the feedback RF signal to generate a baseband feedback signal that is applied to an ADC 318, which converts the baseband feedback analog signal into a baseband feedback digital signal. As with the DAC 306, the ADC 318 may operate at the clock rate that is near or just above the bandwidth of the baseband signal (e.g. only 1.32 times the baseband bandwidth). The feedback digital signal from the ADC 318 is applied to a DPD training module 320, which also receives feedback directly from the DPD 304. The DPD training module 320 models the distortion of the final output signal and generates or adaptively adjusts predistortion coefficients. The DPD 304 predistorts the baseband digital signal using the latest set of predistortion coefficients to reduce or correct the in-band and out-of-band distortion of the final output signal, or just the in-band components in some examples.

Note that FIG. 3 illustrates a closed-loop DPD transmitter. Aspects of the present disclosure may also be implemented within an open-loop DPD transmitter. With open loop DPD, the transmitter does not include feedback features (such as components 316, 318 and 320 of FIG. 1). With open-loop DPD, the predistortion coefficients are not adaptively adjusted by the transmitter while in operation. Rather, coefficients are pre-calibrated using a factory calibration procedure and the predetermined coefficients are stored within the transmitter for use during actual device operation.

Figure 4:
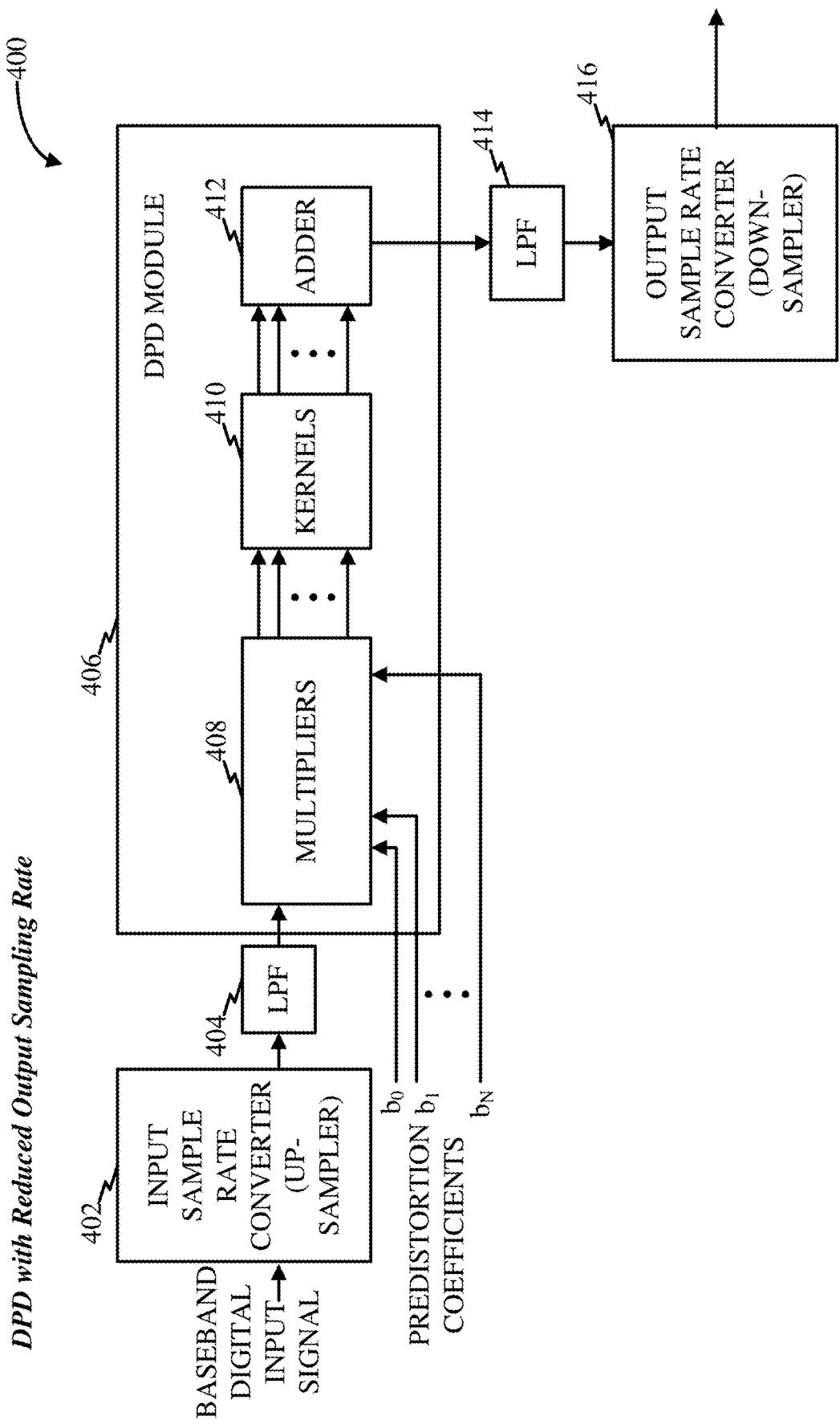
FIG. 4 is a block diagram illustrating an exemplary DPD component for use with the transmitter of FIG. 3, in accordance with aspects of the present disclosure.

FIG. 4 is a block diagram of an exemplary DPD device 400 for use in the transmitter of FIG. 3. An input processing portion of the DPD device 400 includes a first sample rate converter 402 and a first low pass filter (LPF) 404. A DPD module 406 includes multipliers 408, kernels 410, and an adder 412, connected as shown, for applying predistortion. An output processing portion of the DPD 400 device includes a second LPF 414 and a second sample rate converter 416.

The first sample rate converter 402 is equipped or configured to increase the sampling rate of the baseband digital input signal, i.e. it upsamples the input signal by, for example, a factor of five. Upsampling permits the DPD device to apply a more accurate predistortion to the signal (as compared to similar DPDs without upsampling) to better reduce the in-band distortion of the output signal of the power amplifier. The first LPF 404 low pass filters the upsampled signal by an amount sufficient to remove all or most signal replicas from the upsampled signal (using a particular cutoff ratio discussed below). The upsampled signal is then applied to the predistortion module 406, which applies predistortion to the digital signal based on predistortion coefficients $b_0$ to $b_N$ as previously discussed, using a set of multipliers 408, kernels 410 and an adder 412.

The predistorted digital signal is applied to the second LPF 414, which substantially removes out-of-band signal components from the predistorted digital signal (using a cutoff ratio discussed below). This is done so that the subsequent conversion to analog performed by the DAC 306 of FIG. 3 does not cause the out-of-band component to fold back into the in-band and thereby corrupt the in-band signal. The digital-to-analog conversion would otherwise cause the out-of-band component to collapse into the in-band component because the sampling rate of the predistorted digital signal at the predistortion module 406 is at a much higher rate than the rate at which the DAC 306 of FIG. 3 converts the digital signal into an analog signal (since the DAC operates at a much lower rate, e.g., 1.32 times the baseband bandwidth, rather than 5 times the bandwidth).

After the out-of-band signal component of the predistorted signal is substantially removed by LPF 414, the second sample rate converter 416 decreases the sampling rate back to its original sampling rate, e.g. it downsamples the signal by an amount equal to the previous upsampling. This allows the DAC 306 of FIG. 3 to operate near or just above the sampling rate of the original baseband signal (e.g. within a range of 1 to 1.5 times the sampling rate of the original signal). Therefore, the DAC design need not change as compared to the DACs of FIGS. 1 and 2, since it operates at a similar rate as the baseband signal bandwidth or just higher. This allows the transmitter to consume substantially less power than might otherwise be required and reduces the complexity of the DAC (as well as any feedback ADC), as compared to the device of FIGS. 1 and 2, which uses a DAC and an ADC configured to operate at a much higher clock rate.

To achieve accurate predistortion, it is recommended that the predistortion module 406 operate on a significantly oversampled baseband digital signal, hence the use of the first sample rate converter 402 to effectuate such oversampling (e.g. 1:M upsampling where M=5). However, in some systems, it may not be desirable to oversample signals at such a high rate. In such a case, parallel processing may be performed so that each of the parallel predistortion modules operates at about the sampling rate of the input baseband digital signal. The processed signals from the parallel processing are then combined to achieve a predistortion similar to the one performed in FIG. 4. (This alternative implementation is discussed below in connection with FIG. 6.)

Figure 5:
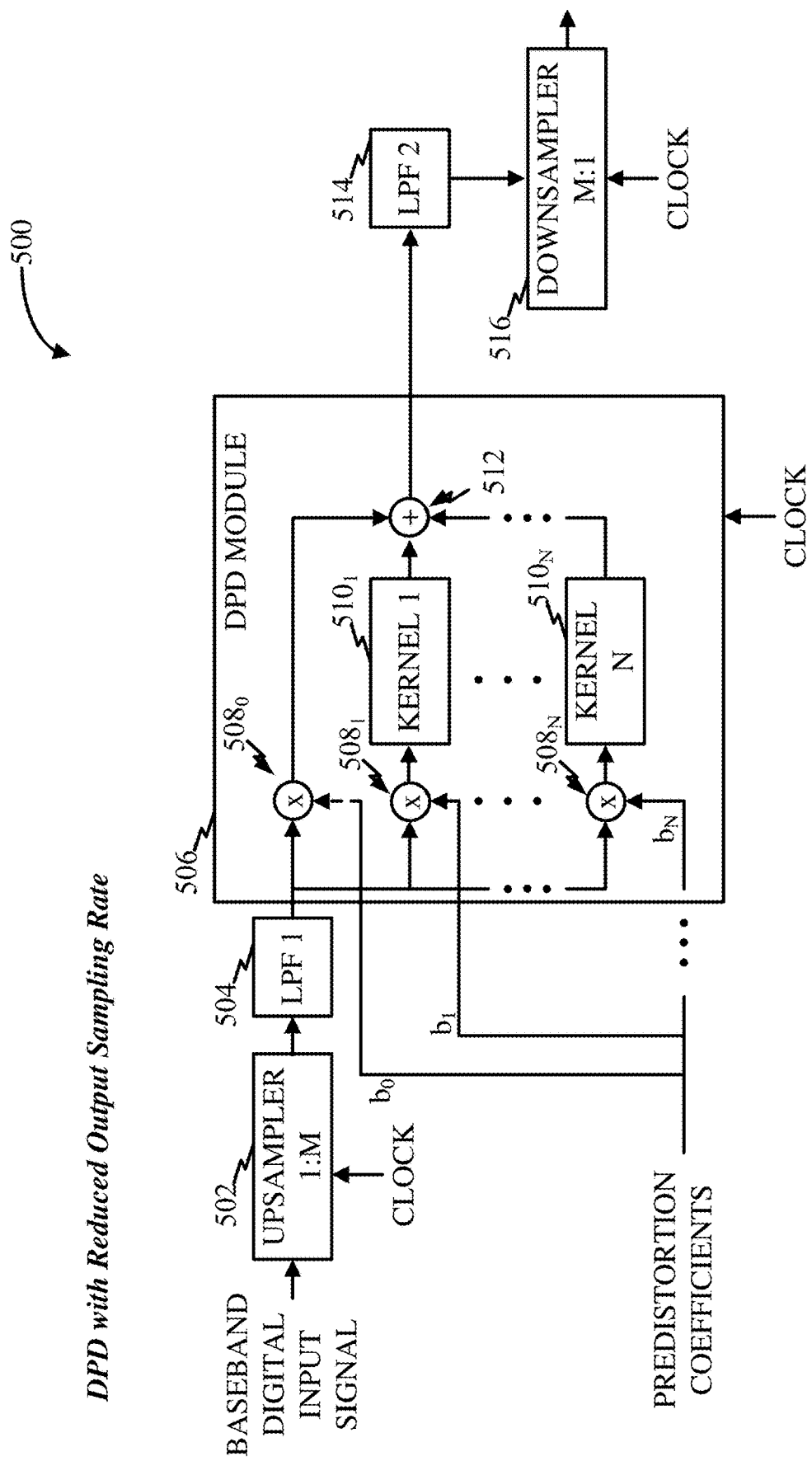
FIG. 5 is a block diagram further illustrating an exemplary DPD component of the transmitter of FIG. 3, in accordance with aspects of the present disclosure.

FIG. 5 is a block diagram that illustrates further details of the exemplary DPD device of FIG. 4 for use in the transmitter of FIG. 3. The DPD device 500 of FIG. 5 includes an upsampler (1:M) 502, a first (pre-DPD) LPF (LPF 1) 504, and a DPD module 506 that includes N+1 multipliers $508_0$-$508_N$, N kernels $510_1$-$510_N$, and an adder 512, connected as shown. The predistortion module 506 includes a second (post-DPD) LPF (LPF 2) 514 and a downsampler (M:1) 516. The upsampler (1:M) 502 upsamples the input baseband digital signal with a relatively high upsampling ratio (e.g. 1:5) to produce a more accurate predistortion to better reduce the in-band distortion of the output signal of the power amplifier. Upsampling may be achieved, for example, by providing zero padding by M−1. The first LPF 504 removes (or "cleans out") the signal replicas from the oversampled signal. For example, LPF 504 may employ a cutoff ratio of $\pi/M$.

The oversampled signal is then applied to the DPD module 506, which performs the predistortion of the baseband digital signal based on predistortion coefficients $b_0$ to $b_N$ using the N parallel multipliers $508_0$-$508_N$, the N parallel kernels $510_1$-$510_N$, and the adder 512 (to combine the N separate feeds). The predistorted digital signal is then applied to the second LPF 514, which substantially removes the out-of-band signal component from the predistorted digital signal. For example, the LPF 514 may use a cutoff ratio of $\pi/(OSF \times M)$ for cleaning the out-of-band emissions, where the oversampling factor (OSF) is the ratio between the system clock rate and the bandwidth of the signal input to the LPF 514. As noted, without the second LPF filter (LPF 514), the out-of-band emissions might collapse the "in-band" due to limited sampling ratio of the system, and thus cause high EVM, corrupting the in-band signal. After the out-of-band signal component of the predistorted signal is removed by the LPF 514, the downsampler (M:1) 516 downsamples the signal back to its original sampling rate. As already discussed, this allows the DAC 306 (of FIG. 3) to operate at substantially the same sampling rate as the original baseband signal (e.g. no more than 1.5× that original baseband rate or, in some examples, 1.32×).

As noted, in some systems, a greater amount of out-of-band nose may be tolerated. Within such systems, the DPD module 506 and the LPF filter 514 may be configured to emphasize in-band filtering more so than out-of-band filtering. For example, the LPF filter 514 may be configured to provide somewhat less filtering of out-of-band components (though sufficient filtering still should be provided to prevent the above-described problem where out-of-band emissions might otherwise corrupt the in-band signals). In some examples, the particular coefficients used by the DPD module 506 may be adapted to emphasize a reduction of in-band distortion rather than out-of-band distortion (especially since a separate out-of-band LPF filter 514 is now employed).

As also noted, in some systems, it may not be desirable to oversample signals at a high rate and so parallel processing is performed with a set of parallel predistortion modules, each operating at about the sampling rate of the input baseband digital signal. The processed signals from the parallel processing are then combined to achieve a predistortion similar to the one performed in FIG. 5 at a higher oversampling rate.

Figure 6:
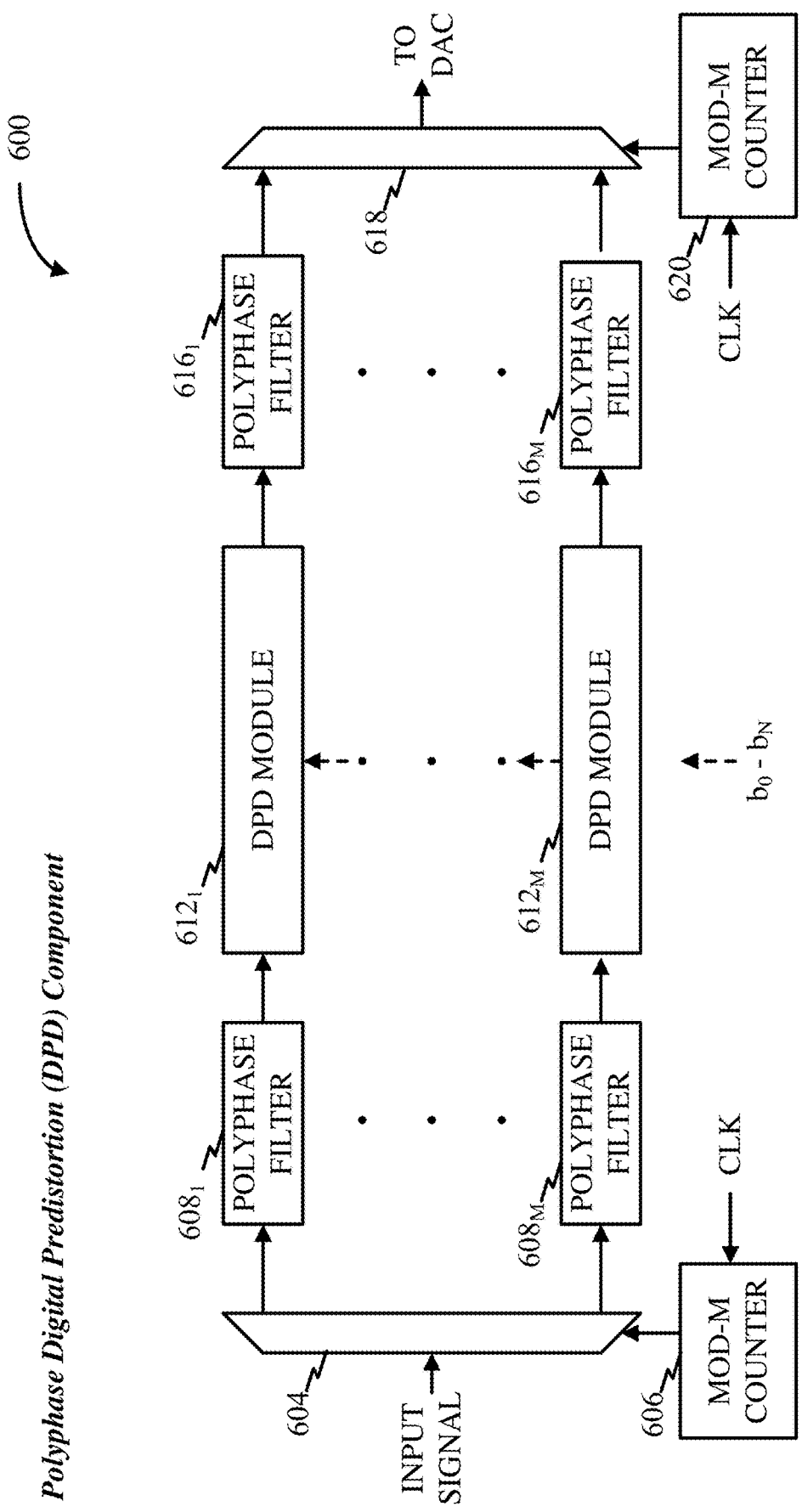
FIG. 6 is a block diagram illustrating an exemplary polyphase DPD component for use with the transmitter of FIG. 3, in accordance with aspects of the present disclosure.

FIG. 6 is a block diagram of an exemplary polyphase DPD device 600 that provides suitable parallel predistortion processing. The DPD device 600 includes a demultiplexer ("DEMUX") 604 with its input receiving the input baseband digital signal (subject to a modulo-M counter 606 driven by a clock signal at the sampling rate of the input baseband digital signal) and a set of M outputs coupled to inputs of a first set of polyphase filters $608_1$-$608_M$, where, for example, M is again 5. Thus, in this configuration, the input signal values are successively provided to the M polyphase filters $608_1$-$608_M$ in a round robin fashion. The polyphase filters $608_1$-$608_M$ collectively decompose the input signal into M signals having an effective sampling rate of 1/M. The M signals are applied to corresponding DPD modules $612_1$-$612_M$, which apply the corresponding predistortion to the respective M signals based on predistortion coefficients $b_0$ to $b_N$.

The predistorted signals at the outputs of the predistortion modules $612_1$-$612_M$ are applied to a second set of M polyphase filters $616_1$-$616_M$. The polyphase filters substantially remove the out-of-band component of each of the signals. Again, as discussed above, this prevents the out-of-band components from being folded back into the in-band when the predistorted baseband digital signal is converted into analog by the DAC of the transmitter device of FIG. 3. The filtered predistorted signals at the output of the polyphase filters $616_1$-$616_M$ are applied to respective M inputs of a multiplexer ("MUX") 618. The MUX 618 multiplexes the M signals from the outputs of the polyphase filters $616_1$-$616_M$ based on a signal generated by a second modulo-M counter 620 driven by a clock at the same sampling rate as the input baseband digital signal. The multiplexed signal is then the predistorted digital signal applied to the DAC 306 of FIG. 3 for conversion into analog as part of the overall transmitter device. Note that with the polyphase implementation of FIG. 6, separate upsamplers and downsamplers are not used (as in the implementation of FIG. 5).

Thus, with the DPD device 600, the high oversampling of the input baseband digital signal used in the DPD device 500 is avoided by employing parallel processing. Note that each of the DPD modules $612_1$-$612_M$ may operate in the same manner as the DPD module 506 of FIG. 5, i.e. each includes multipliers, kernels, and an adder, as already described. Note also that, when employing the polyphase filters, separate LPFs are not used, since the polyphase filters can be equipped to perform the same functions. In other examples, separate LPFs might be used.

Figure 7:
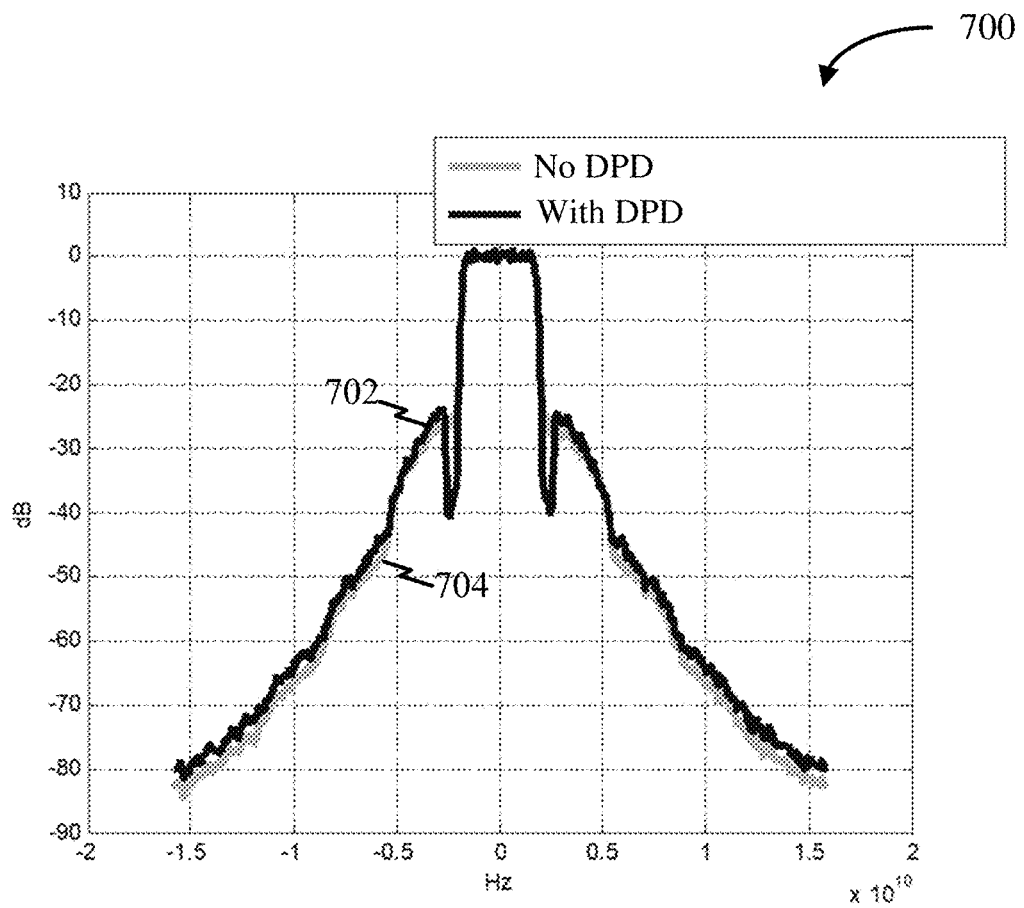
FIG. 7 is a graph illustrating exemplary output signals of a transmitter as a function of frequency for an example where DPD is applied in accordance with aspects of the present disclosure and an example where DPD is not applied.

FIG. 7 is an exemplary graph 700 of output signals (in dB) of a transmitter as a function of frequency (relative to a center frequency shown as 0 Hz) for a first example 702 where DPD is applied using techniques described herein and a second example 704 where DPD is not applied. The backoff (BO), which is a ratio of the PA saturation power to the average output power, is about 7.2 dB for both cases. The bandwidth (BW) of the signal is 4 GHz. The system and DAC sampling ratio is 5.28 GHz. OSF is 1.32. The center portions of the graphs are the in-band signals. The side portions represent out-of-band signals. The graphs show that the EVM for the DPD case is significantly approved as compared to the non-DPD case, since there is a significant notch in the DPD graph 702 just outside the center in-band portion, which is otherwise mostly flat. More specifically, for the DPD case, the transmit EVM is only −34 dB as compared to the transit EVM for the non-DPD case, which is −22.7 dB. The width of the notch is 0.64 GHz.

Illustrative Method Examples of Reduced Output Rate DPD Procedures

Figure 8:
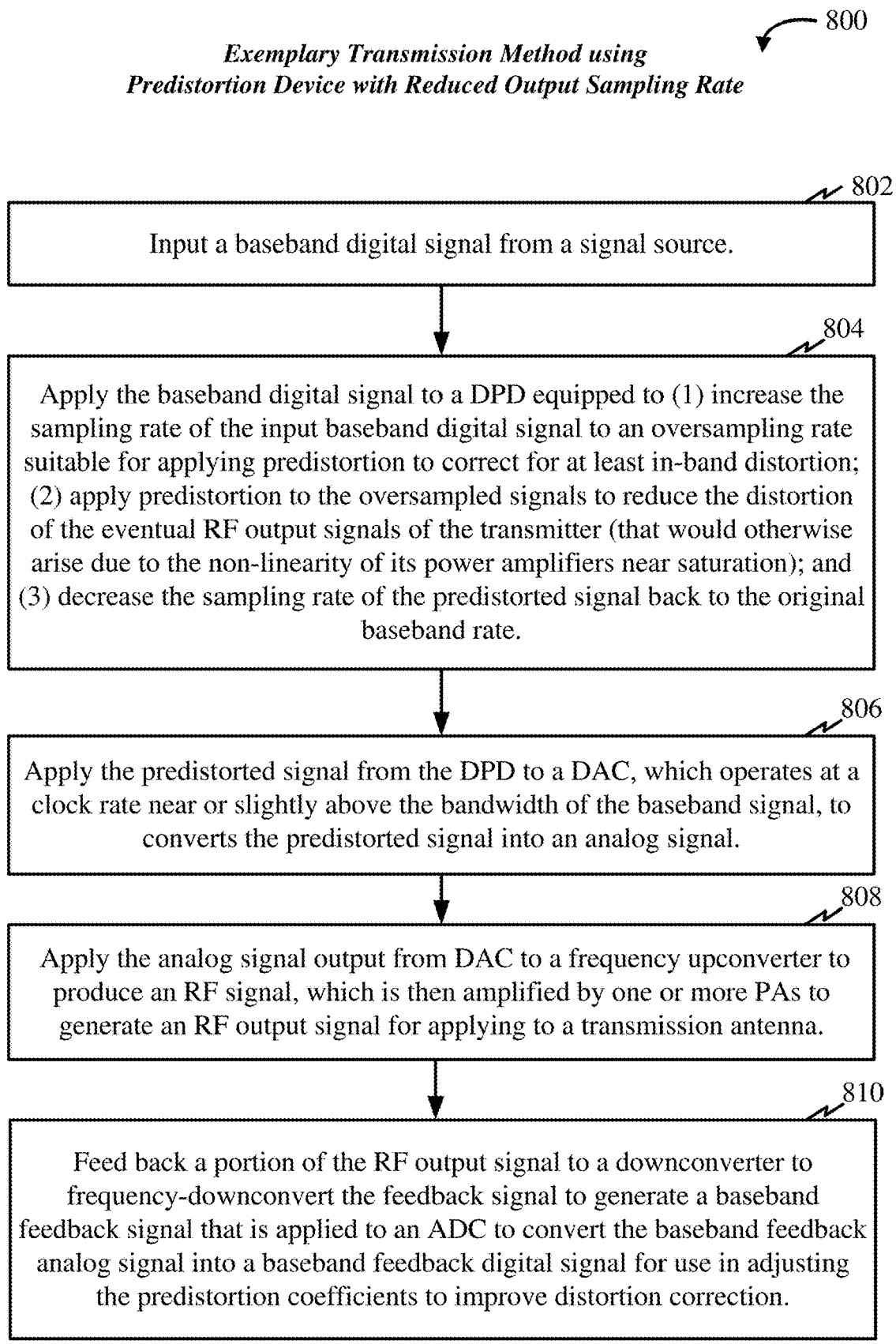
FIG. 8 illustrates exemplary operations that may be performed by a transmitter with reduced output sampling rate DPD, in accordance with aspects of the present disclosure.

FIG. 8 summarizes a method 800 of wireless communications for transmitting signals using the transmitter of FIG. 3 or similarly equipped transmitters. Briefly, at 802, a baseband digital signal is input from a signal source (e.g. other components of a wireless device in which the transmitter is installed). At 804, the baseband digital signal is applied to a DPD equipped to (1) increase the sampling rate of the input baseband digital signal to an oversampling rate suitable for applying predistortion to correct for at least in-band distortion; (2) apply predistortion to the oversampled signals to reduce the distortion of the eventual RF output signals of the transmitter (that would otherwise arise due to the non-linearity of its power amplifiers near saturation); and (3) decrease the sampling rate of the predistorted signal back to the original baseband rate. At 806, the predistorted signal from the DPD is applied to a DAC, which operates at a clock rate near or just above the bandwidth of the baseband signal, to convert the predistorted signal into an analog signal. At 808, the analog signal is output from DAC to a frequency upconverter to produce an RF signal, which is then amplified by one or more PAs of the transmitter to generate an RF output signal for applying to a transmission antenna to transmit into free space. At 810, a portion of the RF output signal is fed back to a downconverter to frequency-downconvert the feedback signal to generate a baseband feedback signal that is applied to an ADC to convert the baseband feedback analog signal into a baseband feedback digital signal for use in adjusting the predistortion coefficients to improve distortion correction.

Figure 9:
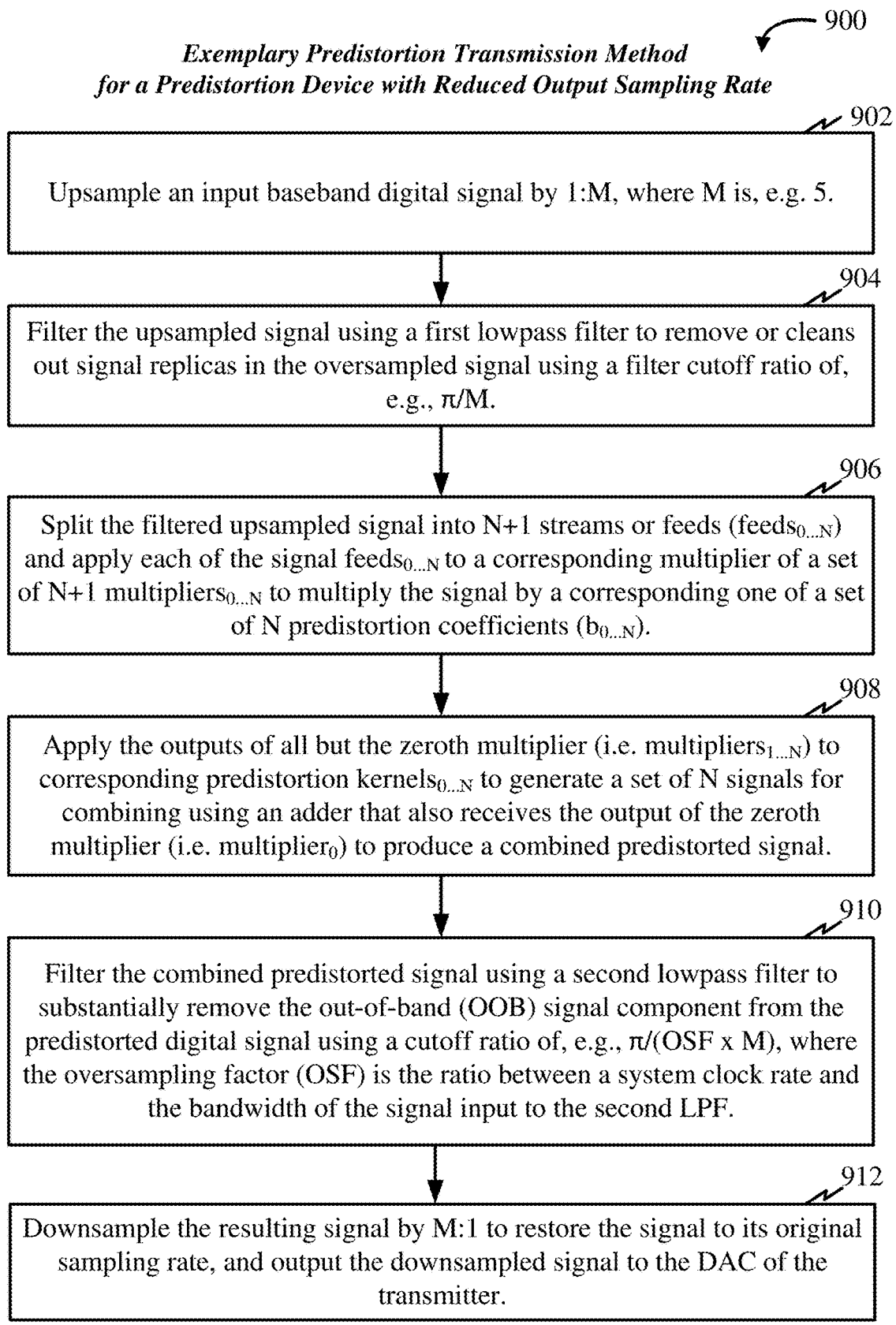
FIG. 9 illustrates exemplary operations that may be performed by reduced output sampling rate DPD device, in accordance with aspects of the present disclosure.

FIG. 9 summarizes a method 900 for predistorting signals using the predistortion module of FIGS. 4 and 5 or similarly equipped devices. The operations of FIG. 9 may correspond to block 804 of FIG. 8. Briefly, at 902, an input baseband digital signal is upsampled by 1:M, where M is, e.g. 5. At 904, the upsampled signal is filtered using a first lowpass filter to remove or clean out signal replicas in the oversampled signal using a cutoff ratio of, e.g., π/M. At 906, the filtered upsampled signal is split into N+1 streams or feeds (e.g. feeds$_{0...N}$) with each of the signal feeds$_{0...N}$ applied to a corresponding multiplier of a set of N+1 multipliers$_{0...N}$ to multiply the signal by a corresponding one of a set of N predistortion coefficients (b$_{0...N}$). At 908, the outputs of all but the zeroth multiplier are applied to corresponding predistortion kernels$_{0...N}$ to generate a set of N signals for combining using an adder that also receives the output of the zeroth multiplier (i.e. multiplier$_0$) to produce a combined predistorted signal. At 910, the combined predistorted signal is filtered using a second lowpass filter to substantially remove the out-of-band signal component from the predistorted digital signal using a cutoff ratio of, e.g., $\pi/(OSF \times M)$, where OSF is the ratio between a system clock rate and the bandwidth of the signal input to the second LPF. At 912, the resulting signal is downsampled by M:1 to restore the signal to its original sampling rate and the downsampled signal is output to the DAC of the transmitter (for further processing by other components of the transmitter, as already described).

FIG. 10 summarizes a method 1000 for predistorting signals using the polyphase predistortion module of FIG. 6 or similarly equipped devices. The operations of FIG. 10 may also correspond to block 804 of FIG. 8. Briefly, at 1002, an input baseband digital signal is demultiplexed into M signals, where, e.g., M is 5, subject to a modulo M counter driven by a clock signal at the sampling rate of the input baseband digital signal to apply signal values in a round robin fashion to a set of M polyphase filters. At 1004, the demultiplexed signals are filtered using the M polyphase filters to decompose the input signal into M signals each having an effective sampling rate of 1/M. At 1006, a set of N+1 predistortion coefficients is applied to each of the upsampled signals using respective predistortion modules for reducing the distortion of the eventual output signal of the transmitting device. At 1008, the resulting M signals are filtered using another set of the M polyphase filters to substantially remove out-of-band components of each of the M signals. At 1010, the M signals are multiplexed based on a signal generated by a second modulo-M counter driven by a clock at the same sampling rate as the input baseband digital signal to restore the signal to its original sampling rate, which is then output to the DAC of the transmitter (for further processing by other components of the transmitter, as already described).

An Illustrative Example of a Wireless Communication System

The techniques described herein may be used for various broadband wireless communication systems, including communication systems that are based on an orthogonal multiplexing scheme. Examples of such communication systems include Spatial Division Multiple Access (SDMA), Time Division Multiple Access (TDMA), Orthogonal Frequency Division Multiple Access (OFDMA) systems, Single-Carrier Frequency Division Multiple Access (SC-FDMA) systems, and so forth. An SDMA system may utilize sufficiently different directions to simultaneously transmit data belonging to multiple user terminals. A TDMA system may allow multiple user terminals to share the same frequency channel by dividing the transmission signal into different time slots, each time slot being assigned to different user terminal. An OFDM system utilizes orthogonal frequency division multiplexing (OFDM), which is a modulation technique that partitions the overall system bandwidth into multiple orthogonal sub-carriers. These sub-carriers may also be called tones, bins, etc. With OFDM, each subcarrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The teachings herein may be incorporated into (e.g., implemented within or performed by) a variety of wired or wireless apparatuses (e.g., nodes). In some aspects, a wireless node implemented in accordance with the teachings herein may comprise an access point or an access terminal.

An access point ("AP") may comprise, be implemented as, or known as a Node B, Radio Network Controller ("RNC"), evolved Node B (eNB), Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or known as a subscriber station, a subscriber unit, a mobile station (MS), a remote station, a remote terminal, a user terminal (UT), a user agent, a user device, user equipment (UE), a user station, or some other terminology. In some implementations, an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), or some other suitable processing device connected to a wireless modem. Accordingly, one or more aspects taught herein may be incorporated into a phone (e.g., a cellular phone or smart phone), a computer (e.g., a laptop), a tablet, a portable communication device, a portable computing device (e.g., a personal data assistant), an entertainment device (e.g., a music or video device, or a satellite radio), a global positioning system (GPS) device, or any other suitable device that is configured to communicate via a wireless or wired medium. In some aspects, the node is a wireless node. Such wireless node may provide, for example, connectivity for or to a network (e.g., a wide area network such as the Internet or a cellular network) via a wired or wireless communication link.

Figure 11:
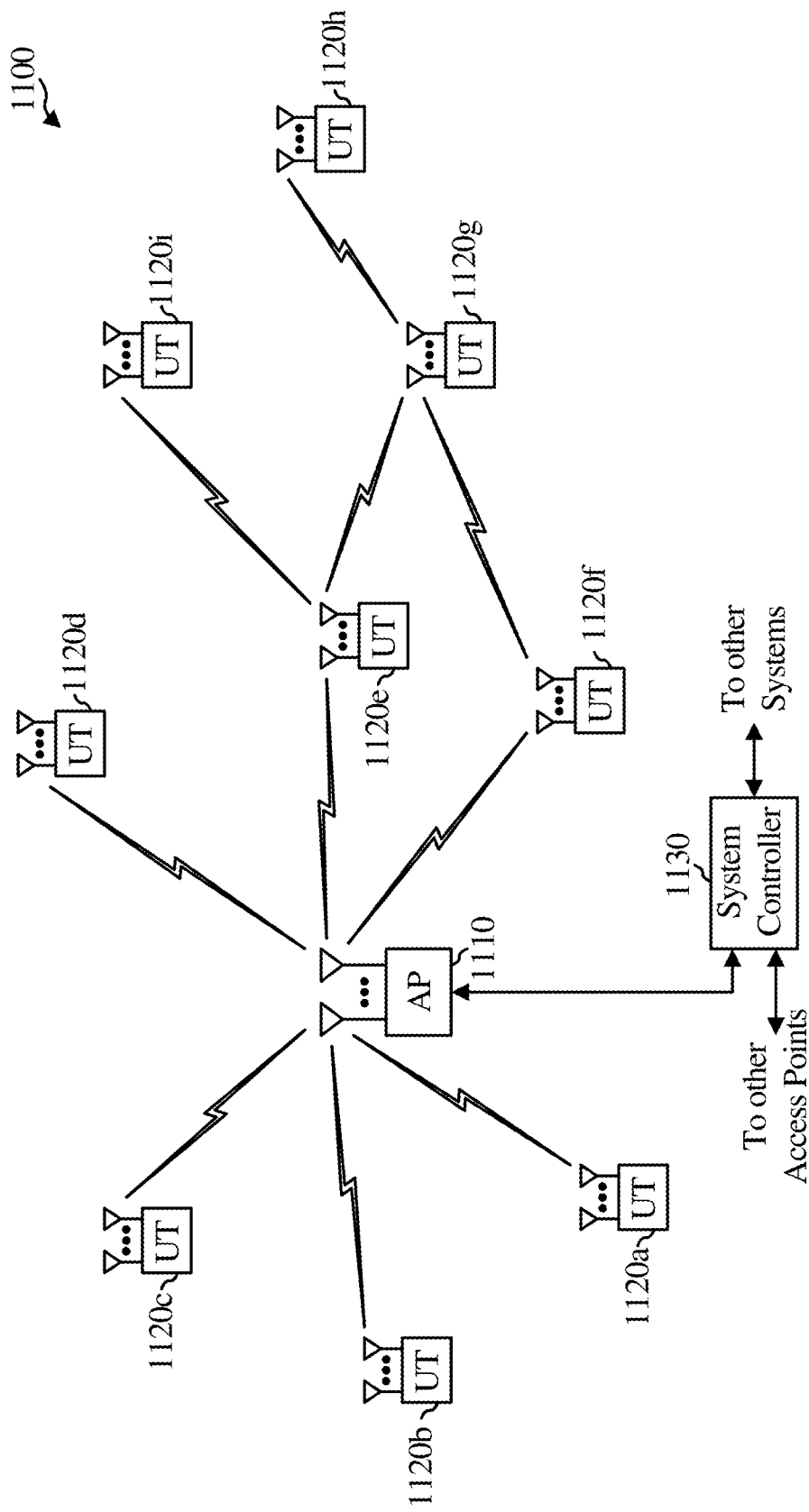
FIG. 11 illustrates an exemplary wireless communications network, in which aspects of the present disclosure may be implemented.

FIG. 11 illustrates a multiple-access multiple-input multiple-output (MIMO) system 1100 with access points and user terminals in which aspects of the present disclosure may be practiced. For example, access point 1110 or user terminals 1120 may include transmitters with the DPD device configured as described above. For simplicity, only one access point 1110 is shown in FIG. 11. An access point is generally a fixed station that communicates with the user terminals and may also be referred to as a base station or some other terminology. A user terminal may be fixed or mobile and may also be referred to as a mobile station, a wireless device, or some other terminology. Access point 1110 may communicate with one or more user terminals 1120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 1130 couples to and provides coordination and control for the access points.

While portions of the following disclosure will describe user terminals 1120 capable of communicating via Spatial Division Multiple Access (SDMA), for certain aspects, the user terminals 1120 may also include some user terminals that do not support SDMA. Thus, for such aspects, an AP 1110 may be configured to communicate with both SDMA and non-SDMA user terminals. This approach may conveniently allow older versions of user terminals ("legacy" stations) to remain deployed in an enterprise, extending their useful lifetime, while allowing newer SDMA user terminals to be introduced as deemed appropriate.

The SDMA system may be a time division duplex (TDD) system or a frequency division duplex (FDD) system. For a TDD system, the downlink and uplink share the same frequency band. For an FDD system, the downlink and uplink use different frequency bands. MIMO system 1100 may also utilize a single carrier or multiple carriers for transmission. Each user terminal may be equipped with a single antenna (e.g., in order to keep costs down) or multiple antennas (e.g., where the additional cost can be supported). The system 1100 may also be a TDMA system if the user terminals 1120 share the same frequency channel by dividing transmission/reception into different time slots, each time slot being assigned to different user terminal 1120.

Figure 12:
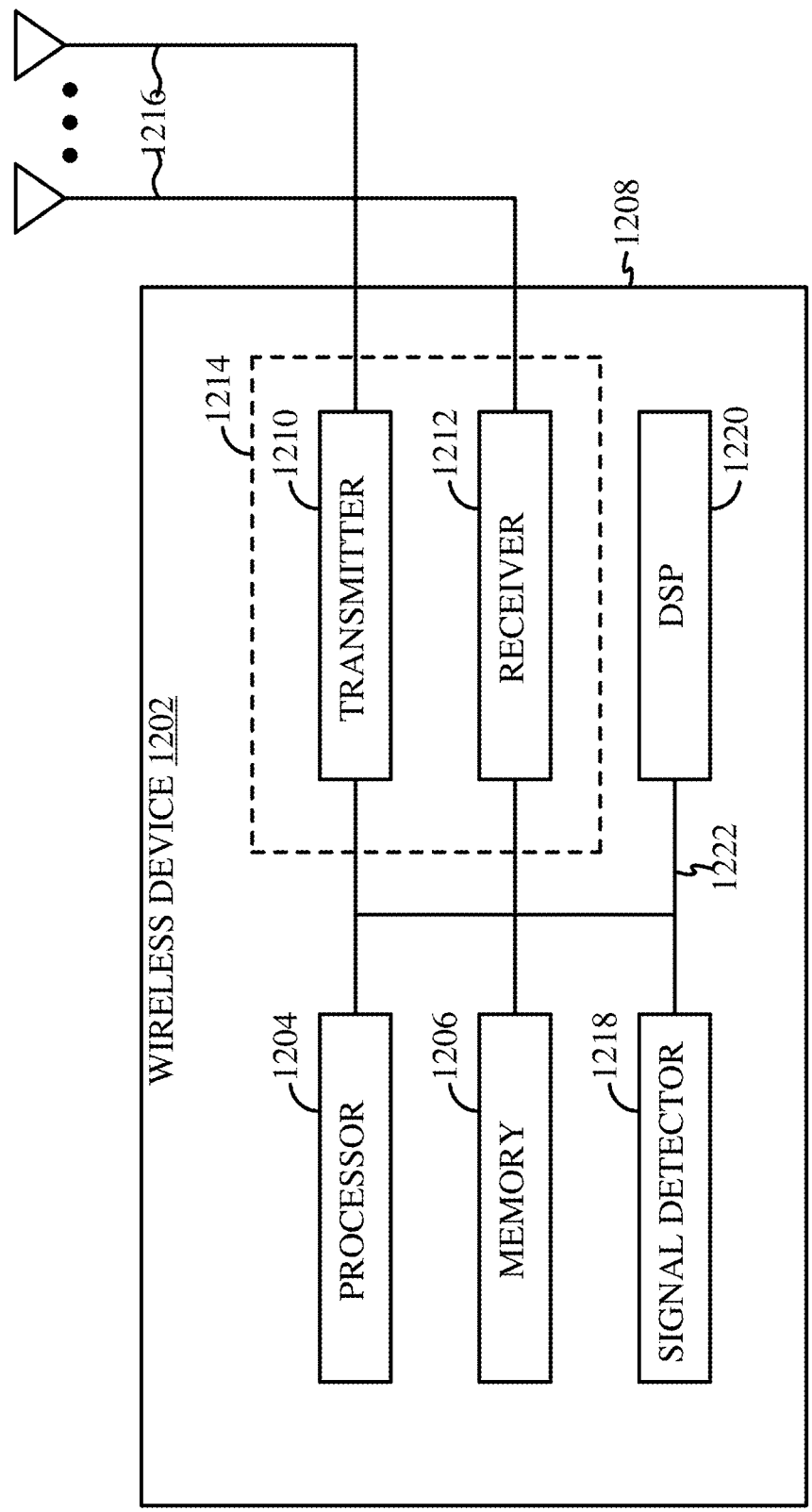
FIG. 12 illustrates an exemplary wireless device, in which aspects of the present disclosure may be implemented.

FIG. 12 illustrates various components that may be utilized in a wireless device 1202 in which aspects of the present disclosure may be practiced and that may be employed within the MIMO system 1100. The wireless device 1202 is an example of a device that may be configured to implement the various methods described herein. The wireless device 1202 may be an access point 1110 or a user terminal 1120.

The wireless device 1202 may include a processor 1204 which controls operation of the wireless device 1202. The processor 1204 may also be referred to as a central processing unit (CPU). Memory 1206, which may include both read-only memory (ROM) and random access memory (RAM), provides instructions and data to the processor 1204. A portion of the memory 1206 may also include non-volatile random access memory (NVRAM). The processor 1204 typically performs logical and arithmetic operations based on program instructions stored within the memory 1206. The instructions in the memory 1206 may be executable to implement the methods described herein. Processor 1204 may, for example, direct all or some of the operations of the various flowcharts of the drawings to implement DPD or other features.

The wireless device 1202 may also include a housing 1208 that may include a transmitter 1210 and a receiver 1212 to allow transmission and reception of data between the wireless device 1202 and a remote location. The transmitter 1210 and receiver 1212 may be combined into a transceiver 1214. A single or a plurality of transmit antennas 1216 or other transmitters may be attached to the housing 1208 and electrically coupled to the transceiver 1214. The wireless device 1202 may also include (not shown) multiple transmitters, multiple receivers, and multiple transceivers. The transmitter 120 may be equipped or configured as described above to perform the operations of the various flowcharts.

The wireless device 1202 may also include a signal detector 1218 that may be used in an effort to detect and quantify the level of signals received by the transceiver 1214. The signal detector 1218 may detect such signals as total energy, energy per subcarrier per symbol, power spectral density and other signals. The wireless device 1202 may also include a digital signal processor (DSP) 1220 for use in processing signals. The various components of the wireless device 1202 may be coupled together by a bus system 1222, which may include a power bus, a control signal bus, and a status signal bus in addition to a data bus.

Summary of Exemplary Operations and Apparatus

Figure 13:
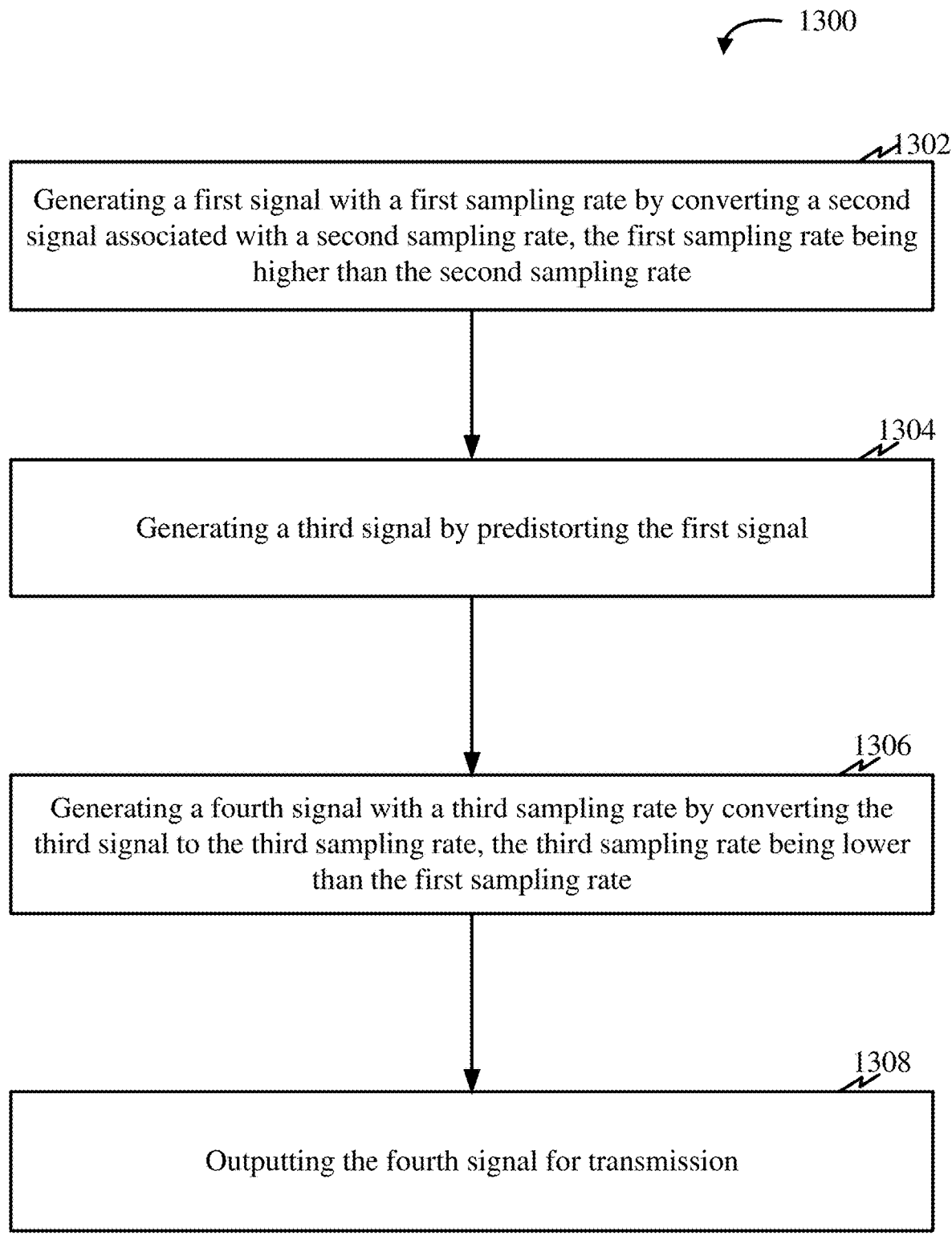
FIG. 13 illustrates exemplary operations that may be performed by the wireless device of FIG. 12, in accordance with aspects of the present disclosure.

FIG. 13 summarizes an exemplary method 1300 that may be performed by an apparatus for applying predistortion to a signal, in accordance with certain aspects of the present disclosure. Briefly, the method 1300 includes generating a first signal with a first sampling rate by converting a second signal associated with a second sampling rate, the first sampling rate being higher than the second sampling rate (block 1302). The method 1300 further includes generating a third signal by predistorting the first signal (block 1304). Additionally, the method 1300 includes generating a fourth signal with a third sampling rate by converting the third signal to the third sampling rate, the third sampling rate being lower than the first sampling rate (block 1306). And, the method 1300 includes outputting the fourth signal for transmission (block 1308).

The fourth signal then may be output to a DAC or other downstream device, allowing the DAC or other downstream device to operate at a lower rate than would otherwise be required if the downstream device instead needed to operate at the increased rate at which predistortion was applied (i.e. the rate of the first predistorted digital signal). In some of the examples described above, a downstream DAC may operate at 2.64 GHz rather than 10 GHz. That is, the DAC may by designed to operate at a clock rate that is relatively close to the bandwidth of a digital baseband input signal rather than a much higher rate, which can substantially reduce the power consumption and complexity of the transmitting device as compared to transmitters requiring a DAC equipped to operate at 10 GHz. In some examples, the second signal is a digital baseband input signal, the first signal is an increased rate digital input signal, the third signal is a first predistorted digital signal, and the fourth signal is a second predistorted digital signal.

Figure 14:
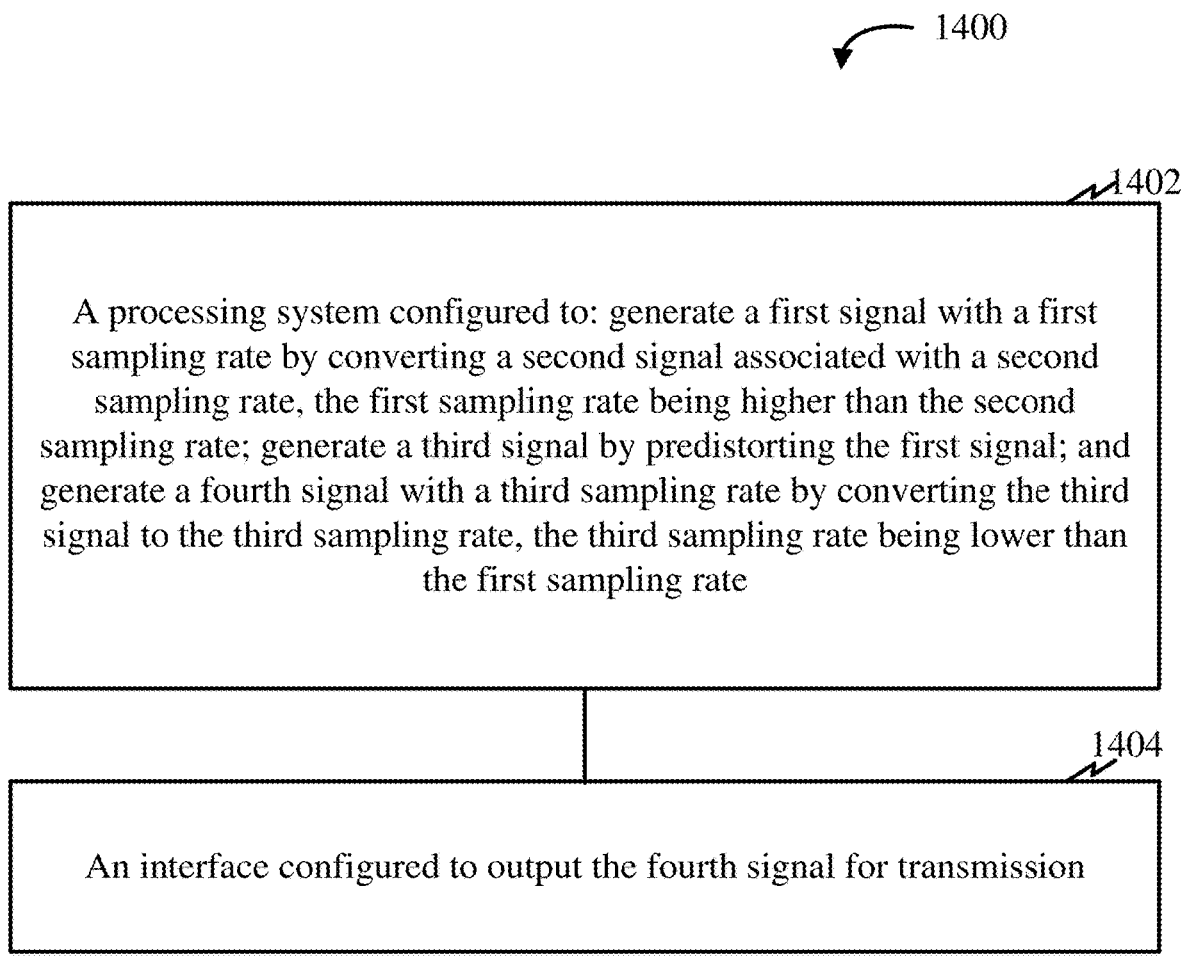
FIG. 14 illustrates exemplary components that may be used to implement the operations of FIG. 13, in accordance with aspects of the present disclosure.

FIG. 14 summarizes an exemplary apparatus or device 1400 having components that may be used to apply predistortion to a signal, in accordance with certain aspects of the present disclosure. Briefly, the apparatus or device 1400 includes a processing system 1402 configured to generate a first signal with a first sampling rate by converting a second signal associated with a second sampling rate, the first sampling rate being higher than the second sampling rate; generate a third signal by predistorting the first signal; and generate a fourth signal with a third sampling rate by converting the third signal to the third sampling rate, the third sampling rate being lower than the first sampling rate. The apparatus 1400 further includes an interface 1404 configured to output the fourth signal for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

Figure 15:
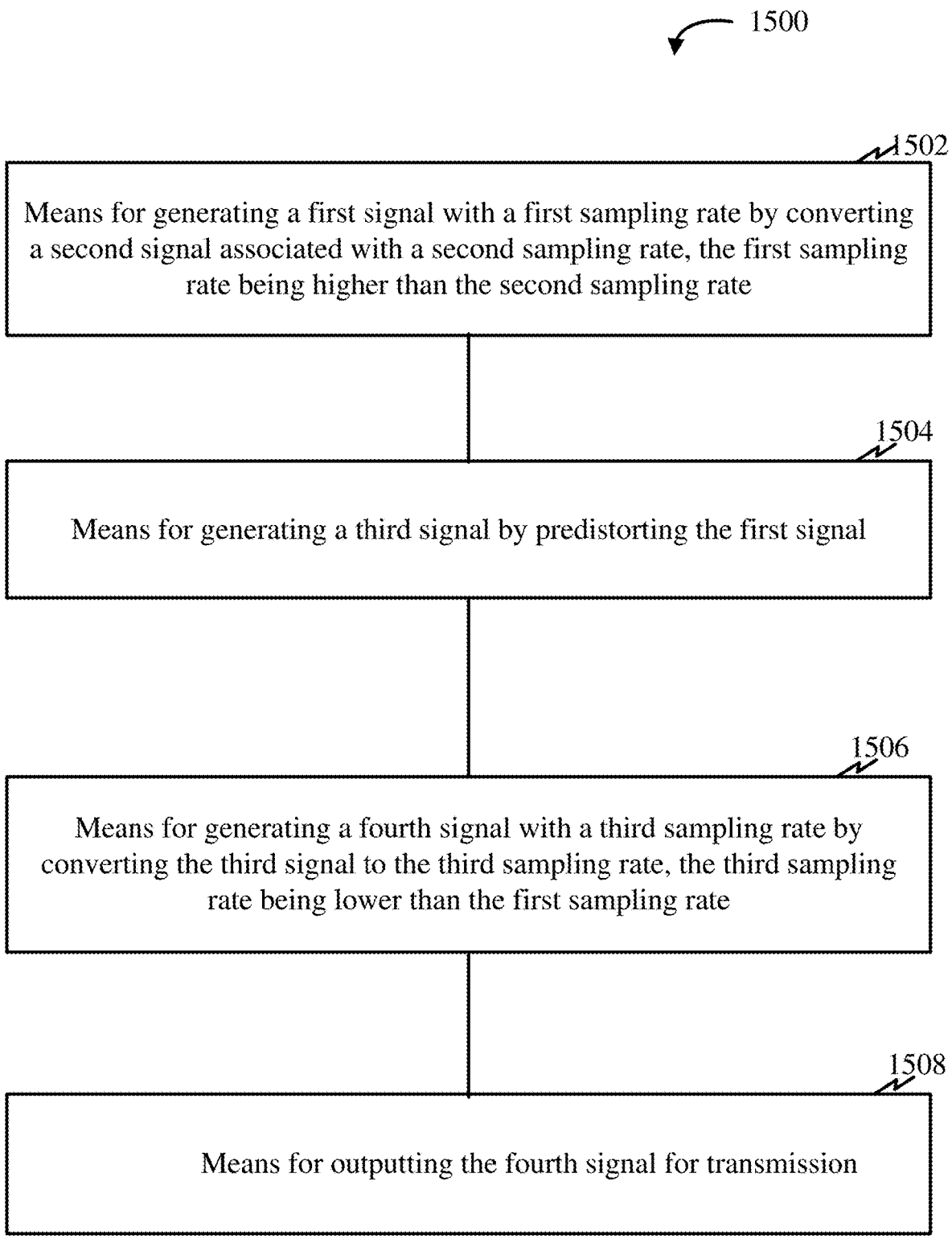
FIG. 15 illustrates other exemplary components that may be used to implement the operations of FIG. 13, in accordance with aspects of the present disclosure.

For example, the individual operations of the method 1300 of FIG. 13 may correspond to individual means of an apparatus 1500 illustrated in FIG. 15, which in turn may correspond with one or more devices or components illustrated in FIGS. 3-6. For instance, the apparatus 1500 includes means 1502 for generating a first signal with a first sampling rate by converting a second signal associated with a second sampling rate, the first sampling rate being higher than the second sampling rate. Such means 1502, for example, includes at least one of the processor 1204, DSP 1220, the upsampler 402 and LPF 404, upsampler 502 and LPF 1 504, or the polyphase filters $608_1$ to $608_M$. The apparatus 1500 further includes means 1504 for generating a third signal by predistorting the first signal. Such means 1504, for example, includes at least one of the processor 1204, DSP 1220, the DPD module 406 including the multipliers 408, kernels 410, and adder 412, the DPD module 506 including the multipliers $508_0$ to $508_N$, or the DPD modules $612_1$ to $612_M$. The apparatus 1500 includes means 1506 for generating a fourth signal with a third sampling rate by converting the third signal to the third sampling rate, the third sampling rate being lower than the first sampling rate. Such means 1506 includes, for example, at least one of the processor 1204, DSP 1220, the downsampler 416, the downsampler 516, or the polyphase filters $616_1$ to $616_M$. The apparatus 1500 further includes means 1508 for outputting the fourth signal for transmission. Such means 1508 includes, for example, at least one of the bus system 1222 and the interface between the DPD 304 or the DAC 306.

Regarding other means, means for removing signal replicas from the second signal includes, for example, at least one of the processor 1204, DSP 1220, LPF 404, or LPF 1 504. Means for low pass filtering the second signal with a cutoff ratio of $\pi/M$, where M is a ratio of the first sampling rate to the second sampling rate includes, for example, at least one of the processor 1204, DSP 1220, LPF 404, or LPF 1 504. Means for generating the fourth signal further comprises means for filtering out-of-band signal components from the third signal includes, for example, at least one of the processor 1204, DSP 1220, LPF 414, or LPF 2 514. Means for generating the fourth signal further comprises means for low pass filtering the third signal with a cutoff ratio of $\pi/(OSF \times M)$, where the oversampling factor (OSF) is a ratio between a system clock rate and a bandwidth of the second signal, and wherein M is a ratio of the first sampling rate to the second sampling rate includes, for example, at least one of the processor 1204, DSP 1220, LPF 404, or LPF 1 504.

Regarding additional means, means for multiplying the first signal by a set of predistortion coefficients to generate a first set of intermediate signals includes, for example, at least one of the processor 1204, DSP 1220, multipliers 408, or multipliers $508_0$ to $508_N$. Means for generating a second set of intermediate signals by modifying at least some of the first set of intermediate signals by a set of predistortion kernels, respectively, includes, for example, at least one of the processor 1204, DSP 1220, kernels 410, or kernels 1-N $510_1$ to $510_N$. Means for summing the second set of intermediate signals includes, for example, at least one of the processor 1204, DSP 1220, adder 412, or adder 512. Means for downsampling the second signal includes, for example, at least one of the processor 1204, DSP 1220, downsampler 416, downsampler 516, or polyphase filters $616_1$ to $616_M$.

Regarding further means, means for polyphase filtering the second signal to generate the first signal includes, for example, at least one of the processor 1204, DSP 1220, or polyphase filter $608_1$ to $608_M$. Means for demultiplexing the second signal includes, for example, at least one of the processor 1204, DSP 1220, or demultiplexer 604. Means for polyphase filtering the third signal to generate the fourth signal while filtering out-of-band components of the third signal includes, for example, at least one of the processor 1204, DSP 1220, or polyphase filters $616_1$ to $616_M$. Means for multiplexing the fourth signal includes, for example, at least one of the processor 1204, DSP 1220, or multiplexer 618.

These are just some examples of particular means-plus-function components described herein and other suitable devices or components may be used.

In some examples, a non-transitory computer readable medium may be provided that has instructions stored thereon for controlling a transmitter device, such as the transmitter device of FIG. 3. The instructions may serve to control the operation of a control processor (such as processor 1204 of FIG. 12) to control a transmitter (such as the transmitter 1210 of FIG. 12).

Figure 16:
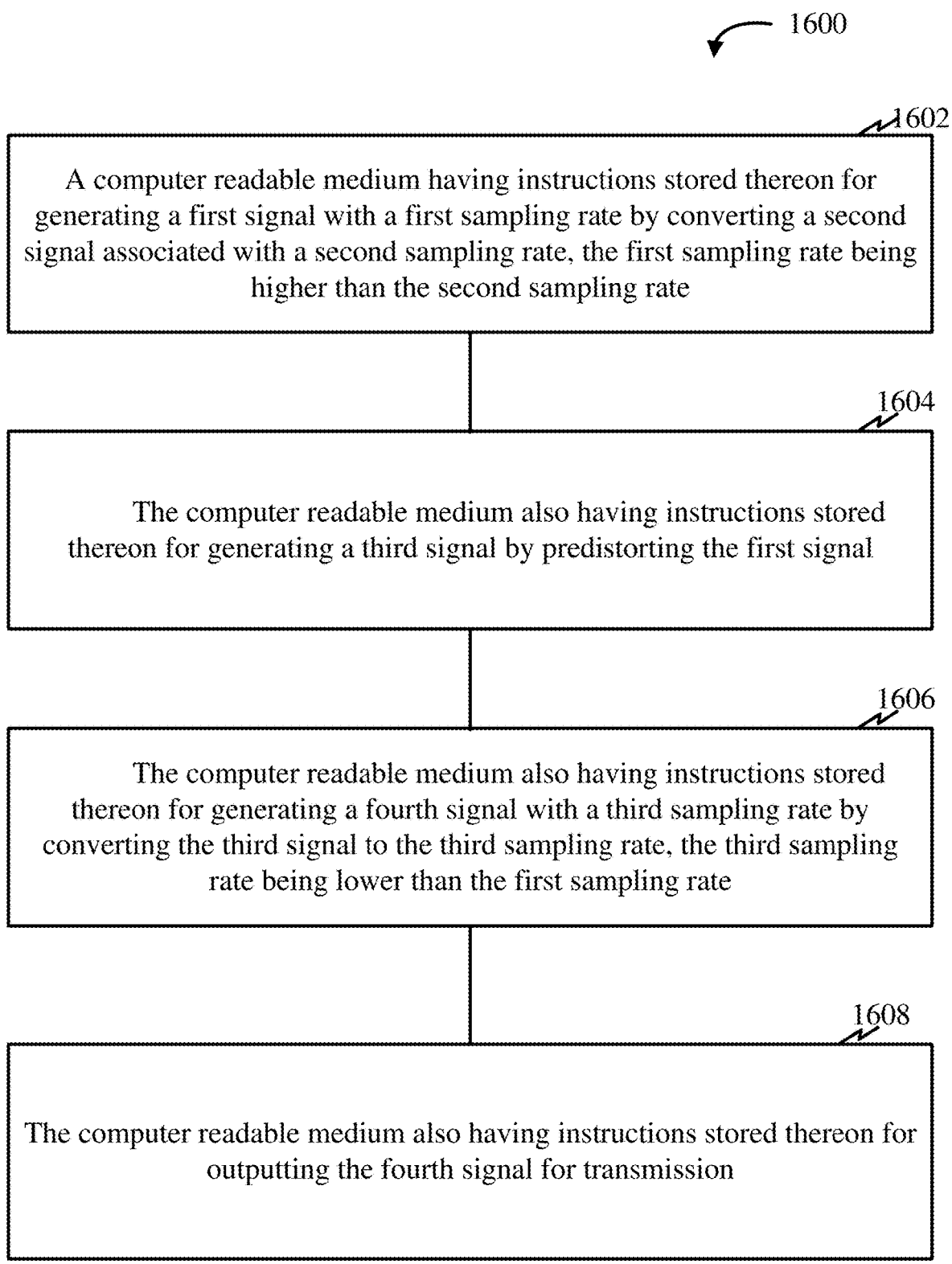
FIG. 16 illustrates exemplary computer readable medium instructions that may be used to control a transmitter to perform the operations of FIG. 13, in accordance with aspects of the present disclosure.

FIG. 16 illustrates exemplary non-transitory computer readable media and their instructions. Briefly, a computer readable medium 1600 may be provided having instructions 1602 stored thereon for generating a first signal with a first sampling rate by converting a second signal associated with a second sampling rate to the first sampling rate, the first sampling rate being higher than the second sampling rate. The computer readable medium may also have instructions 1604 stored thereon for generating a third signal by predistorting the first signal. The computer readable medium may also have instructions 1606 stored thereon for generating a fourth signal with a third sampling rate by converting the third signal to the third sampling rate, the third sampling rate being lower than the first sampling rate. The computer readable medium may also have instructions 1608 stored thereon for outputting the fourth signal for transmission. These are just some examples of instructions that may be stored in a non-transitory computer readable medium and used to control one or more components or devices. Generally speaking, any of the functions or method operations described herein may have a corresponding set of instructions for use in controlling, or at least activating or deactivating, the respective device or component.

As used herein, the term "generating" encompasses a wide variety of actions. For example, "generating" may include calculating, causing, computing, creating, determining, processing, deriving, investigating, making, producing, providing, giving rise to, leading to, resulting in, looking up (e.g., looking up in a table, a database or another data structure), ascertaining and the like. Also, "generating" may include receiving (e.g., receiving information), accessing (e.g., accessing data in a memory) and the like. Also, "generating" may include resolving, selecting, choosing, establishing and the like.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Also, "determining" may include measuring, estimating and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any such list including multiples of the same members (e.g., any lists that include aa, bb, or cc).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the wireless node, all which may be accessed by the processor through the bus interface. Alternatively, or in addition, the machine-readable media, or any portion thereof, may be integrated into the processor, such as the case may be with cache and/or general register files.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for wireless communications, comprising:
   a processing system configured to:
   generate a first signal with a first sampling rate by converting a second signal associated with a second sampling rate and reducing signal replicas resulting from the conversion by low pass filtering with a first cutoff ratio, the first sampling rate being higher than the second sampling rate;
   generate a third signal by predistorting the first signal; and
   generate a fourth signal with a third sampling rate by converting the third signal to the third sampling rate and reducing out-of-band signal components due to the conversion of the second signal by low pass filtering with a second cutoff ratio different than the first cutoff ratio by a defined oversampling factor (OSF), the third sampling rate being lower than the first sampling rate; and
   an interface configured to output the fourth signal for transmission.

2. The apparatus of claim 1, wherein the second signal is a digital baseband input signal, the first signal is an increased rate digital input signal, the third signal is a first predistorted digital signal, and the fourth signal is a second predistorted digital signal.

3. The apparatus of claim 1, wherein the processing system is configured to generate the first signal such that the first sampling rate of the first signal is at least three times higher than the second sampling rate of the second signal.

4. The apparatus of claim 1, wherein the processing system is configured to generate the fourth signal such that the third sampling rate of the fourth signal is less than 1.5 times the second sampling rate of the second signal.

5. The apparatus of claim 1, wherein the first cutoff ratio is $\pi/M$, where M is a ratio of the first sampling rate to the second sampling rate.

6. The apparatus of claim 1, wherein the second cutoff ratio is $\pi/(OSF \times M)$, where the oversampling factor (OSF) is a ratio between a system clock rate and a bandwidth of the second signal, and wherein M is a ratio of the first sampling rate to the second sampling rate.

7. The apparatus of claim 1, wherein the processing system is configured to predistort the first signal by at least:
   multiplying the first signal by a set of predistortion coefficients to generate a first set of intermediate signals; and
   generating a second set of intermediate signals by modifying at least some of the first set of intermediate signals by a set of predistortion kernels, respectively, and
   wherein the generation of the third signal comprises summing the second set of intermediate signals.

8. The apparatus of claim 1, wherein conversion of the second signal comprises upsampling the second signal to generate the first signal.

9. The apparatus of claim 1, wherein conversion of the third signal comprises downsampling the third signal to generate the fourth signal.

10. A wireless node, comprising:
    a processing system configured to:
    generate a first signal with a first sampling rate by converting a second signal associated with a second sampling rate and reducing signal replicas resulting from the conversion by low pass filtering with a first cutoff ratio, the first sampling rate being higher than the second sampling rate;
    generate a third signal by predistorting the first signal; and
    generate a fourth signal with a third sampling rate by converting the third signal to the third sampling rate and reducing out-of-band signal components due to the conversion of the second signal by low pass filtering with a second cutoff ratio different than the first cutoff ratio by a defined oversampling factor (OSF), the third sampling rate being lower than the first sampling rate; and a transmitter configured to transmit the fourth signal.

11. The wireless node of claim 10, wherein the transmitter includes a digital to analog (DAC) converter configured to convert the fourth signal from a digital format into an analog format prior to transmitting the fourth signal, the DAC being equipped to operate at a clock rate equal or below the first sampling rate.

* * * * *